United States Patent [19]

Hamilton

[11] Patent Number: 4,932,062
[45] Date of Patent: Jun. 5, 1990

[54] METHOD AND APPARATUS FOR FREQUENCY ANALYSIS OF TELEPHONE SIGNALS

[75] Inventor: Chris A. Hamilton, Montclair, N.J.
[73] Assignee: Dialogic Corporation, New Jersey
[21] Appl. No.: 351,393
[22] Filed: May 15, 1989
[51] Int. Cl.$^5$ .............................. G10L 5/00
[52] U.S. Cl. ........................ 381/43; 381/46; 364/726; 364/485
[58] Field of Search ............ 381/43, 46; 364/726, 364/485

[56] References Cited

U.S. PATENT DOCUMENTS

| | | | |
|---|---|---|---|
| 4,016,544 | 4/1977 | Morita et al. | 340/703 X |
| 4,310,838 | 1/1982 | Juso et al. | 340/701 |
| 4,635,048 | 1/1987 | Nishi et al. | 340/701 X |
| 4,689,613 | 8/1987 | Ikeda | 340/703 |
| 4,724,431 | 2/1988 | Holtey et al. | 340/701 X |

*Primary Examiner*—Emanuel S. Kemeny

[57] ABSTRACT

For faster realtime analysis related to Discrete Fourier Transform (DFT), prestored pre-multiplied values of amplitude times cosine and sine functions are used. Method and apparatus for determining the content of a predetermined frequency bin f in the frequency spectrum of a signal and, in particular, a signal which occurs in a telephone network, includes the step of storing on a storage means:

$$C_k(x_k, n) = x_k * \cos(2\pi k n/N) \text{ and}$$
$$S_k(x_k, n) = x_k * \sin(2\pi k n/N)$$

for: $k = 0, \ldots, (N-1)$; $n = 0, \ldots, (n-1)$; and $x_k$ ranging over all the values of the set of M predetermined digital levels into which the amplitude of the signal is mapped, if the signal is a digital signal, or into which a sample of the amplitude of the signal is mapped, if the signal is an analog signal. N is a predetermined number of amplitudes or samples of the amplitude of the signal which are used in analyzing the frequency spectrum and n is a frequency index.

20 Claims, 3 Drawing Sheets

FIG. 1

METHOD AND APPARATUS FOR FREQUENCY ANALYSIS OF TELEPHONE SIGNALS

TECHNICAL FIELD OF THE INVENTION

The present invention pertains to the field of frequency analysis of signals and, in particular, to method and apparatus for performing frequency analysis of signals which occur in a telephone network such as the public telephone network. Further, in particular, the present invention pertains to method and apparatus for performing frequency analysis of signals using processors wherein multiplication requires a substantially longer time to perform than addition.

BACKGROUND OF THE INVENTION

It is well known to those of ordinary skill in the art that automated systems for use in telecommunications applications typically require the capability of analyzing and identifying signals which are transmitted over a telephone network, such as, for example, the public telephone network, in order to function properly. For example, it is well known that, under certain conditions, specific machine-generated single-frequency signals, denoted as "call-progress" signals, are transmitted over a telephone network to indicate call status conditions. Examples of commonly occurring call status conditions are busy, call-pickup, operator-intercept and so forth and examples of commonly occurring "call-progress" signals which are used to indicate these call status conditions include, without limitation, SIT tones (system intercept tones), answering machine tones, and so forth.

In addition to machine-generated single-frequency signals, it is also well known that automated systems for use in telecommunications voice processing applications require the capability of analyzing and identifying machine-generated communication signals such as ringback, dial tone, dual tone multifrequency (DTMF) tones, and so forth, as well as signals which are produced by human speech, noise and hum, and so forth. Such a capability of analyzing and identifying signals has many uses which are well known to those of ordinary skill in the art. For example, if an automated system places a call over the public telephone network to a predetermined telephone number, the automated system needs to have the capability of analyzing and identifying a whole host of signals which correspond, for example, to ringback, operator interception, human voice response to the telephone call, and so forth. In addition, because certain voice processing applications require a human to respond to queries with specific spoken responses, an automated system in such an application needs to have the capability of analyzing the signal produced by the human speech and of identifying the particular spoken response the called party gave.

In addition to the above-described need for an automated system to have the capability of analyzing and identifying signals, it is well known to those of ordinary skill in the art that it is desirable for the automated system to have the capability of analyzing and identifying signals rapidly enough so that the automated system can take an action which is an appropriate response to the identified signal.

In addition to the above-described need for an automated system to have the capability of analyzing and identifying signals rapidly enough for the automated system to provide an appropriate response to the identified signal, it is well known to those of ordinary skill in the art that the automated system advantageously should have the capability of analyzing and identifying signals which occur in analog signals or in digital signals. Further, in this regard, it is well known that the capability of analyzing and identifying signals which occur in an analog signal typically comprises a step of providing a digital representation of the analog signal and that there are many methods for performing such an analog-to-digital signal conversion. For example, one may use a linear analog-to-digital conversion method or a differential analog-to-digital conversion method—many such differential analog-to-digital conversion methods are well known to those of ordinary skill in the art collectively as delta modulation and there are many different forms thereof, such as, for example, DM (delta modulation), ADPCM (adaptive differential pulse code modulation), CVSD (continuously variable slope delta modulation), and so forth.

It well known to those of ordinary skill in the art that the capability of analyzing and identifying signals referred to above typically requires an automated system to perform an analysis of the frequency spectrum of a signal. In particular, one method which is well known to those of ordinary skill in the art for determining the frequency spectrum of a signal is the discrete Fourier Transform (DFT) which is used to determine the frequency spectrum of a signal. The DFT for a real signal is defined as follows:

$$R_n = \sum_{k=0}^{N-1} [x_k * \cos(2\pi kn/N)] \tag{1}$$

$$n = 0, 1, \ldots, (N-1)$$

$$I_n = -\sum_{k=0}^{N-1} [x_k * \sin(2\pi kn/N)]$$

where:
- $x_k$ are a set of N consecutive digital samples of the amplitude of the signal to be analyzed;
- n is a frequency index;
- $R_n$ and $I_n$ are the real and imaginary frequency coefficients, respectively; and
- the frequency bandwidth of each frequency bin n is equal to (Sample Rate)/N.

As one can readily appreciate from the above, an automated system that uses the DFT set forth in eqn. (1) needs to execute multiplications and additions in apparatus such as a processor. Further, in order for the automated system to analyze and identify the signal in order to provide an appropriate response thereto, it needs to execute the DFT rapidly to provide appropriate portions of the frequency spectrum. As a result, the apparatus in the automated system which executes the required multiplications and additions must execute them rapidly. However, as is well known to those of ordinary skill in the art, the need for apparatus which executes multiplications and additions rapidly has been a problem and, as a result, much activity has been directed towards developing methods for providing the frequency spectrum of a signal which reduce the number of multiplications and additions required in order to improve the speed at which such a frequency spectrum can be provided.

One method which is well known to those of ordinary skill in the art for carrying out the DFT set forth in eqn. (1) entails storing the values of the trigonometric functions in a memory. However, this method is inadequate in certain applications because it requires a large number of multiplications and additions to provide the full frequency spectrum of a signal, which number is given by:

$2N^2$ multiplications + $2N^2$ additions: all frequency bins

Further improvements in speed occur in certain applications where it is not necessary to compute the coefficients $R_n$ and $I_n$ for each frequency bin in the frequency spectrum. In such a case, one requires the following number of multiplications and additions to provide the coefficients for a single frequency bin:

$2N$ multiplications + $2N$ additions: per bin

Another method which is well known in the art for carrying out the DFT set forth in eqn. (1) is known as the fast Fourier transform (FFT). The FFT is a method which takes advantage of specific symmetry features of trigonometric functions to provide the full frequency spectrum of a signal. The number of multiplications and additions which are required to provide the full frequency spectrum of a signal using the FFT is given by:

$N\log_2 N$ multiplications + $N\log_2 N$ additions: all frequency bins

Although the FFT requires fewer arithmetic operations to provide the entire frequency spectrum than the DFT, when using the FFT one must necessarily determine the content of all frequency bins in the frequency spectrum. As a result of this, in certain application where it is not necessary to compute the coefficients $R_n$ and $I_n$ for each frequency bin in the frequency spectrum, it can take less time to determine the coefficients for the limited number of frequency bins which are of particular interest with the DFT than it does to determine the coefficients for each frequency bin with the FFT. In addition, a further advantage in using the DFT instead of the FFT in such cases is that the DFT permits one to save a little time by performing the multiplications and additions on the "fly," i.e., as the samples are obtained instead of having to wait untill all N samples have been collected as is required with the FFT.

An additional problem occurs when either the DFT or the FFT is used to provide an analysis of the frequency spectrum of a signal. This problem is that a multiplication in a typical processor takes substantially longer to perform than an addition. For example, when one uses the well known 80188 microprocessor which is available from INTEL Corp., a multiplication can take from 5 to 10 times longer than an addition. As a result of this relatively slow multiplication, use of either the DFT or the FFT is prohibitively inefficient and may prevent an automated telephone interactive system from using such microprocessors for analyzing and identifying signals.

As one can readily appreciate from the above, there is a need in the art for method and apparatus for performing frequency analysis of signals rapidly. Further, there is such a need for method and apparatus for performing such frequency analysis using microprocessors wherein a multiplication takes substantially longer to perform than an addition. Still further, there is a need in the art for method and apparatus for performing such frequency analysis of analog signals and of digital signals, whether the digital signals are digitally encoded by a differential encoding scheme or a non-differential encoding scheme such as a linear encoding scheme, a u-law encoding scheme, an A-law encoding scheme, a pulse code modulation (PCM) encoding scheme and so forth.

Lastly, there is a need in the art for method and apparatus for use in automated systems in telecommunications voice processing applications which can identify and differentiate between certain human responses such as, for example between a human response of "yes" and a human response of "no."

SUMMARY OF THE INVENTION

Embodiments of the present invention advantageously solve the above-identified problems in the art by providing method and apparatus for performing frequency analysis of signals rapidly and, in particular, by providing method and apparatus for performing frequency analysis of signals which occur in a telephone network rapidly. Further, embodiments of the present invention advantageously provide method and apparatus for performing such frequency analysis rapidly using microprocessors wherein a multiplication takes substantially longer to perform than an addition.

Specifically, an embodiment of the invention method for determining the content of a predetermined frequency bin f in the frequency spectrum of an analog signal comprises the steps of:

(1) storing:

$C_k(x_k,n) = x_k*\cos(2\pi k n/N)$ and
$S_k(x_k,n) = x_k*\sin(2\pi k n/N)$ for:
k=0, ..., (N−1); n=0, ..., (N−1); and $x_k$ ranging over all the values of the set of M predetermined digital levels of a sample of the analog signal where:
N is a predetermined number of samples of the analog signal, which predetermined number of samples are used in analyzing the frequency spectrum;
n is an index of frequency bins of the frequency spectrum; and
$x_k$, the digital level of a sample, is restricted to being selected from a predetermined set of M possible amplitude values (2) sampling the analog signal to provide the $j^{th}$ sample value and determining $x_j$, the particular one of the predetermined set of M amplitude values which corresponds thereto;

(3) retrieving the values of $C_j(x_j,f)$ and $S_j(x_j,f)$ from storage;

(4) accumulating the sum of $C_j(x_j,f)$ and $S_j(x_j,f)$ for the predetermined number of N samples to determine the real and imaginary part of the content of predetermined frequency bin f.

A preferred embodiment of the above-described method comprises an embodiment wherein the step of retrieving comprises using the sample values $x_j$ as a pointer into storage for retrieving the values of $C_j(x_j,f)$ and $S_j(x_j,f)$. Further, embodiments of the inventive method which take advantage of certain symmetries of the sine and cosine function will be described in detail below.

As one can readily appreciate from the above, the inventive method advantageously requires only 2N additions in real time to determine the content of a frequency bin in the frequency spectrum of a signal. Consequently, the estimated ratio of processor operation time per bin required to perform the direct DFT as compared to the inventive method is given by:

$$T_1 = 1 + \frac{\text{(time to perform a multiplication)}}{\text{(time to perform an addition)}}$$

In particular, for the above-described INTEL 80188, the inventive method operates approximately 5-10 times faster per bin than the direct DFT.

In addition to this advantage over the direct DFT, the inventive method also provides an advantage over the FFT in certain cases where one does not need to determine the content of all the frequency bins in the frequency spectrum. For example, if one confines his interest to a subset L of the N bins in the frequency spectrum, the ratio of processor operation time required for the FFT to that required for the inventive method is given by:

$$T_2 = T_1 * [\log_2 N)/2L]$$

As an example, if the number of samples N=256, one would need to know the content of at least 24 frequency bins to justify the use of the FFT over the use of the inventive method.

In addition, the above-described inventive method may be used to provide the content of a predetermined frequency bin in the frequency spectrum of a digital signal by omitting the sampling step. Further, as will be described in detail below, the results provided by the inventive method may be used in a great many applications involving a digital signal, for example, in applications pertaining to a digital signal which occurs in a telephone network, without regard to whether the digital signal was digitally encoded using a differential encoding scheme or by a non-differentially encoding scheme such as a linear encoding scheme, a u-law encoding scheme, an A-law encoding scheme, a pulse code modulation (PCM) encoding scheme and so forth.

Further in addition, the invention method and apparatus may be used as part of an inventive method and apparatus for identifying a signal corresponding to a human voice response of "yes.". Embodiments of the inventive method and apparatus for identifying a signal corresponding to a human voice response of "yes," identifies this signal on the basis of the variation of the energy content of various frequency bins in the frequency spectrum of the signal over time. In particular, a preferred embodiment of the inventive method and apparatus, performs a DFT using 8 samples and determines the dynamic behavior of two predetermined frequency bins. Specifically, a preferred embodiment of the inventive method and apparatus used with a signal which is transmitted over a telephone network having a 3000 Hz bandwidth: (a) utilizes a sampling rate of 6000 Hz and determines a measure of the energy of the signal in frequency bins surrounding 750 Hz and 2250 Hz, respectively; (b) determines the fraction of the sum of the energy measure in these two bins which occurs in the frequency bin at the higher frequency over time; and (c) identifies the signal as having been produced by a "yes" if the fraction of the sum of the energy measure in the higher frequency bin is large at the end of the sound, i.e., when the energy of the signal falls below a predetermined level.

In general, embodiments of the inventive method and apparatus compare the variation in the fraction of energy which occurs in the higher frequency bin over time with a library of predetermined envelopes of such variations. The library of predetermined envelopes are stored, for example, in a memory. The embodiment identifies the human voice response which produced the signal by comparing the variation of energy with the library envelopes. If no match is determined, a voice processing application can ask for a further response from the speaker in order to provide the system another chance for properly interpreting the human voice response.

BRIEF DESCRIPTION OF THE DRAWING

A complete understanding of the present invention may be gained by considering the following detailed description in conjunction with the accompanying drawing, in which.

To facilitate understanding, identical reference numerals have been used to denote identical elements common to the figures.

DETAILED DESCRIPTION

Figure 1:
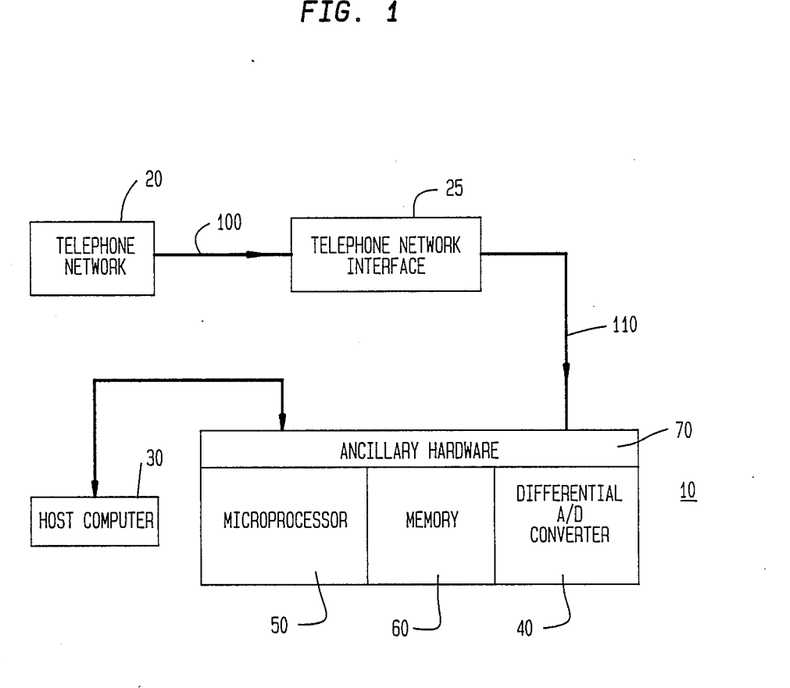
FIG. 1 shows, in pictorial form, a block diagram of a preferred embodiment of the inventive apparatus for detecting signals on a telephone line and analyzing the frequency spectrum thereof.

FIG. 1 shows a block diagram of a preferred embodiment of inventive apparatus DM 10 and the manner in which it is used for detecting signals on a telephone line and for analyzing the frequency spectrum thereof to identify the human response which produced the signal. Further, as will be described in detail below, this preferred embodiment of inventive apparatus DM 10 can be used to identify a signal which was produced by a human voice response of "yes."

As shown in FIG. 1, telephone signal 100 from telephone network 20 is transmitted by telephone network interface 25 to DM 10 as signal 110. Many apparatus for use as telephone interface 25 are well known to those of ordinary skill in the art. For example, one such apparatus comprises a portion of a DIALOG/41 Digitized Voice and Telephony Computer Interface circuit which is available from Dialogic Corporation, 129 Littleton Road, Parsippany, N.J. 07054. In pertinent part, this circuit comprises well known means for interfacing with the telephone network to send and receive calls; means, such as transformers, to electrically isolate subsequent circuits; and filter circuits.

Signal 100 which is output from telephone network interface 25 is applied as input to DM 10 and, in particular, to ancillary hardware 70. Specifically, signal 110 is applied to a sample and hold circuit (not shown) in ancillary hardware 70, which sample and hold circuits are well known to those of ordinary skill in the art.

The output from the sample and hold circuit contained in ancillary hardware 70 is applied to differential analog-to-digital converter 40. There are many circuits which are well known to those of ordinary skill in the art that can be used as differential analog-to-digital converter 40. For example, differential analog-to-digital converter 40 may be a Motorola MC3518 CVSD encoder which is available from Motorola Semiconductor Products Division of Austin Texas, an Oki Electric MSM5218 ADPCM encoder which is available from Oki Semiconductor of Sunnyvale, Calif., or any other such equipment. The differentially encoded signal output from differential analog-to-digital converter 40 is placed, sample by sample, into a tri-state buffer (not shown) for subsequent tranmsittal to a data bus (not shown). A tri-state buffer for performing this function is well known to those of ordinary skill in the art. For example, the tri-state buffer may be a TI 74LS244 tri-state buffer which is available from Texas Instruments of Dallas, Tex., or any other such equipment.

DM 10 further comprises microprocessor 50, memory 60, and a portion of ancillary hardware 70 for use interfacing with a host computer 30. Microprocessor 50 may be any one of a number of microprocessors which are well known to those of ordinary skill in the art such as an INTEL 8086 or an INTEL 80188 microprocessor which are available from INTEL of Santa Clara, Calif., or any other such equipment. Memory 60 may be any one of a number of memory equipments which are well known to those of ordinary skill in the art such as an HITACHI 6264 RAM memory which is available from HITACHI America Ltd. of San Jose, Calif., or any other such equipment. The portion of ancillary hardware 70 which interfaces with host computer 30 may be readily fabricated by those of ordinary skill in the art by using circuits which are also well known to those of ordinary skill in the art. For example, the portion of ancillary hardware 70 which interfaces with host computer 30 may be comprised of TI 74LS245 data bus transceivers, TI 74LS244 address buffers, and TI PAL 16L8 control logic, all of which is available from Texas Instruments of Dallas, Texas, or any other such equipment. Finally, as shown in FIG. 1, DM 10 interfaces with host computer 30, which may be any one of a number of computers which are well known to those of ordinary skill in the art such as, for example, an IBM PC/XT/AT, or any other such equipment.

The differentially encoded digital samples output from differential analog-to-digital encoder 40 are placed in the buffer (not shown) and are output, in turn, therefrom to the data bus (not shown). Then, the digital samples are received from the data bus, digital sample by digital sample, by microprocessor 50.

As stated above, apparatus DM 10 identifies a signal which was produced by a human voice response of "yes." In so doing, DM 10 determines the content of certain predetermined frequency bins of the frequency spectrum of incoming telephone signal 100. Advantageously, the inventive method for identifying a signal produced by a human voice response of "yes" does not depend on a determination of exact values of the frequency content of the predetermined frequency bins in the frequency spectrum of incoming signal 100. As a result, embodiments of the inventive method can utilize ADPCM digitally encoded sample values of signal 100 without the need to convert the ADPCM samples into linear PCM sample values. This is advantageous because this broadens the applicability of the inventive method and apparatus and saves the time required to perform such conversions. Further, an additional advantage is that the inventive method and apparatus can be used when incoming signal 100 is already a digital signal because, in such applications, there is no need to convert the input digital signal, which input digital signal may been encoded using u-law or A-law PCM, into a linear PCM format. Because of this, in describing the inventive method, we will merely refer to the samples which are used in the inventive method and apparatus as digital samples.

Before describing a preferred embodiment for identifying a signal which was produced by a human voice response of "yes," we will describe the method by which the content of predetermined frequency bins in the frequency spectrum of incoming signal 100 is determined. After that, we will describe how this method is used in the preferred embodiment of the inventive method and apparatus to identify a signal which was produced by a human voice response of "yes."

In accordance with the inventive method, the total set of possible sample values of the amplitude of the input analog signal is restricted to a predetermined set of amplitude values. Further, the frequency spectrum analysis is performed using a predetermined number of samples, N, from the analog signal and the bandwidth of each frequency bin in the frequency spectrum is equal to the sample rate divided by N. In performing the inventive method, as an initialization step, the inventive apparatus performs the following calculations and stores the results, for example, in a memory means:

$$C_k(x_k,n) = x_k * \cos(2\pi kn/N) \text{ and}$$
$$S_m(x_k,n) = x_k * \sin(2\pi kn/N) \quad (2)$$

for:
  $k=0, \ldots, (N-1)$; $n=0, \ldots, (N-1)$; and $x_k$ ranging over all the values of the set of M pre digital levels of a sample of the analog signal where:
  N is the predetermined number of samples of the analog signal, which predetermined number of samples are used in analyzing the frequency spectrum;
  n is an index of frequency bins of the frequency spectrum; and
  $x_k$, the digital level of a sample, is restricted to being selected from a predetermined set of M possible amplitude values.

This initialization step may be performed in many ways which are well known to those of ordinary skill in the art, for example, the calculations may be performed in microprocessor 50 and the results may be stored in memory 60 in a manner which is well known to those of ordinary skill in the art or the calculations may be performed in host computer 30 and transferred to memory 60, or the calculations may be placed in a ROM which is associated with DM 10, and so forth.

We can take advantage of the symmetry of sine and cosine functions and, thereby, limit the number of values $C_k(x_k,n)$ and $S_k(x_k,n)$ that must be stored in a preferred embodiment of the inventive method. For example, when b bits are used to represent the allowed amplitude values, there are $M=2^b$ possible values in the predetermined set of amplitude values and, in this case, we will show that we only need to store $N2^{b-2}$ different values of $C_k(x_k,n)$ and $S_k(x_k,n)$.

The following describes a preferred method for storing values of $C_k(x_k,n)$ and $S_k(x_k,n)$ for $k=0, \ldots N-1$; $n=0, \ldots, N-1$; and $x_k=0,1,\ldots,2^b-1$. This preferred method takes advantage of the rotational symmetry of sine and cosine functions. For example, let $nk=pN+r$, where p and r are integers. Then:

$$\cos(2\pi nk/N) = \cos[2\pi(p+r/N)] = \cos(2\pi r/N)$$

and $$\sin(2\pi nk/N) = \sin[2\pi(p+r/N)] = \sin(2\pi r/N)$$

For simplicity, in the following, we will use the following notation:

$$\cos(2\pi r/N) = C(r) \text{ and } \sin(2\pi r/N) = s(r)$$

As a result of the above, there are only N distinct values of the sine and cosine, which possible distinct values correspond to $r = 0, \ldots, N-1$.

Further, if N is evenly divisible by 4, one can take advantage of the following relations to map the possible values of C(r) and S(r) for $r = 0, \ldots, N-1$ into values of C(r) in the range of $0 \leq r \leq N/4$:

TABLE I

| Range of f | Value of C(r) in the range | Value of S(r) in the range |
|---|---|---|
| $0 \leq r \leq N/4$ | $C(r)$ | $S(r) = C(N/4 - r)$ |
| $N/4 \leq r \leq N/2$ | $C(r) = -C(N/2 - r)$ | $S(r) = C(r - N/4)$ |
| $N/2 \leq r \leq 3N/4$ | $C(r) = -C(r - N/2)$ | $S(r) = -C(3N/4 - r)$ |
| $3N/4 < r \leq N-1$ | $C(r) = C(N - r)$ | $S(r) = -C(r - 3N/4)$ |

As one can readily appreciate from this, there are only $N/4+1$ different values of C(r) and S(r). Further, since $C(r=0)=1$ and $C(r=N/4+1)=0$, there are, in reality, only $N/4-1$ different values of C(r) and S(r). Thus, if we use b bits to represent the allowed amplitude values of $x_k$, i.e., $0, \ldots, 2^b-1$, we need only store approximately $2^b N/4$ or $N2^{b-2}$ different premultiplied values of an amplitude value and a cosine function. Note that the actual number of premultiplied values that are stored, i.e., $2^b*(N/4+1)$, $2^b*(N/4)$, or $2^b*(N/4-1)$, depends on the exact manner in which storage is constructed. In particular, where the possible values in the predetermined set of amplitude values are in the range of $0, \ldots, 2^b-1$ and we utilize $N/4-1$ different cosine values, we can arrange storage as follows:

$0*C(1), 1*C(1), \ldots (2^b-1)*C(1), 0*C(2), 1*C(2), \ldots (2^b-1)*C(2), \ldots (2^b-1)*C(N/4-1)$.

As a result of the above, we have the following memory requirements:

TABLE II

| N | b = 4 | b = 5 | b = 6 | b = 7 | b = 8 |
|---|---|---|---|---|---|
| 8 | 16 | 32 | 64 | 128 | 256 |
| 64 | 128 | 256 | 512 | 1024 | 2048 |
| 256 | 1024 | 2048 | 4096 | 8192 | 16364 |

As one can readily appreciate from the above, the inventive method is particular well suited to applications wherein the required spectral resolution is low and the quantization is large. For example, as will be set forth in more detail below, to identify a signal which is produced by a human voice response of "yes," we can use $N=8$. Further, if we use 4 bit resolution for the digital encoding, we need only store 16 values of $C_k(x_k,n)$ and $S_k(x_k,n)$ in memory to use the inventive method. However, even if we need 24 Hz frequency resolution to identify a particular communications tone, since this resolution corresponds to $N=256$ at a sampling frequency of 6000 Hz, for 4 bit resolution in the digital sample encoding we would still only require approximately 1024 of memory for storage of $C_k(x_k, n)$ and $S_k(x_k,n)$. In addition, for wider data formats, the inventive method may still be useful for spectral estimation if the remaining steps in the inventive method are performed on the 8 or so most significant bits.

Continuing our description of the inventive method for identifying an analog signal which is produced by a human voice response of "yes," the analog signal is sampled and the sample amplitude is converted to a digital value $x_j$ for this $j^{th}$ sample. The values of $C_j(x_j,f)$ are then retrieved from storage. As set forth above, these values correspond to the product of the amplitude of the $j^{th}$ sample and the sine and cosine functions from eqn. (1) for the $f^{th}$ frequency bin in the frequency spectrum of the analog signal. In the preferred embodiment of this method, the amplitude of the $j^{th}$ sample, $x_j$, provides a pointer for retrieving the values of $C_j(x_j,f)$ and $S_j(x_j,f)$ from storage. Finally, the values of $C_j(x_j,f)$ and $S_j(x_j,f)$ are accumulated over N consecutive samples to provide the real and imaginary parts of the content of the $f^{th}$ frequency bin in the frequency spectrum of the analog signal.

Figures 2, 2A:
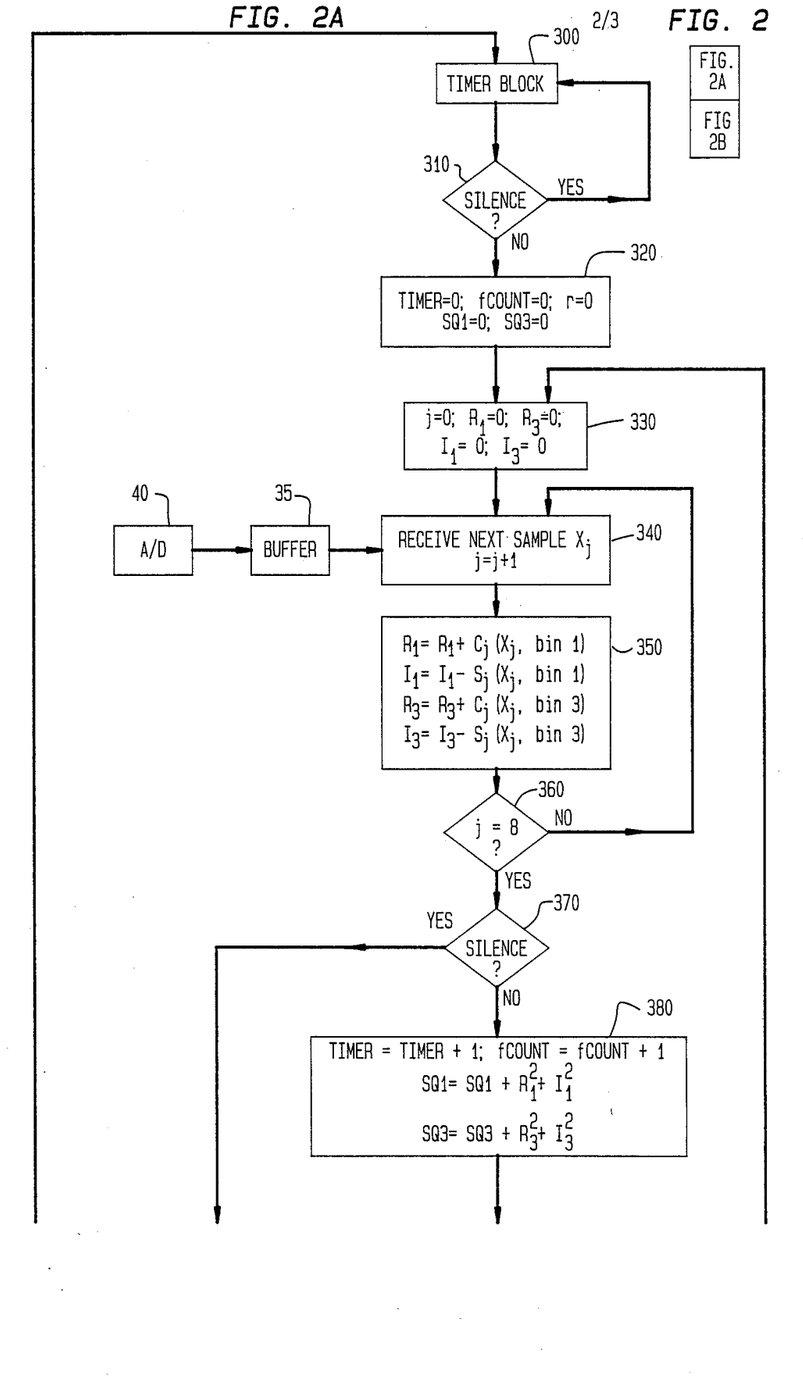
FIGS. 2A and 2B show a flow chart of a microprocessor program which forms part of a preferred embodiment of the inventive apparatus shown in FIG. 1.
Figure 2B:
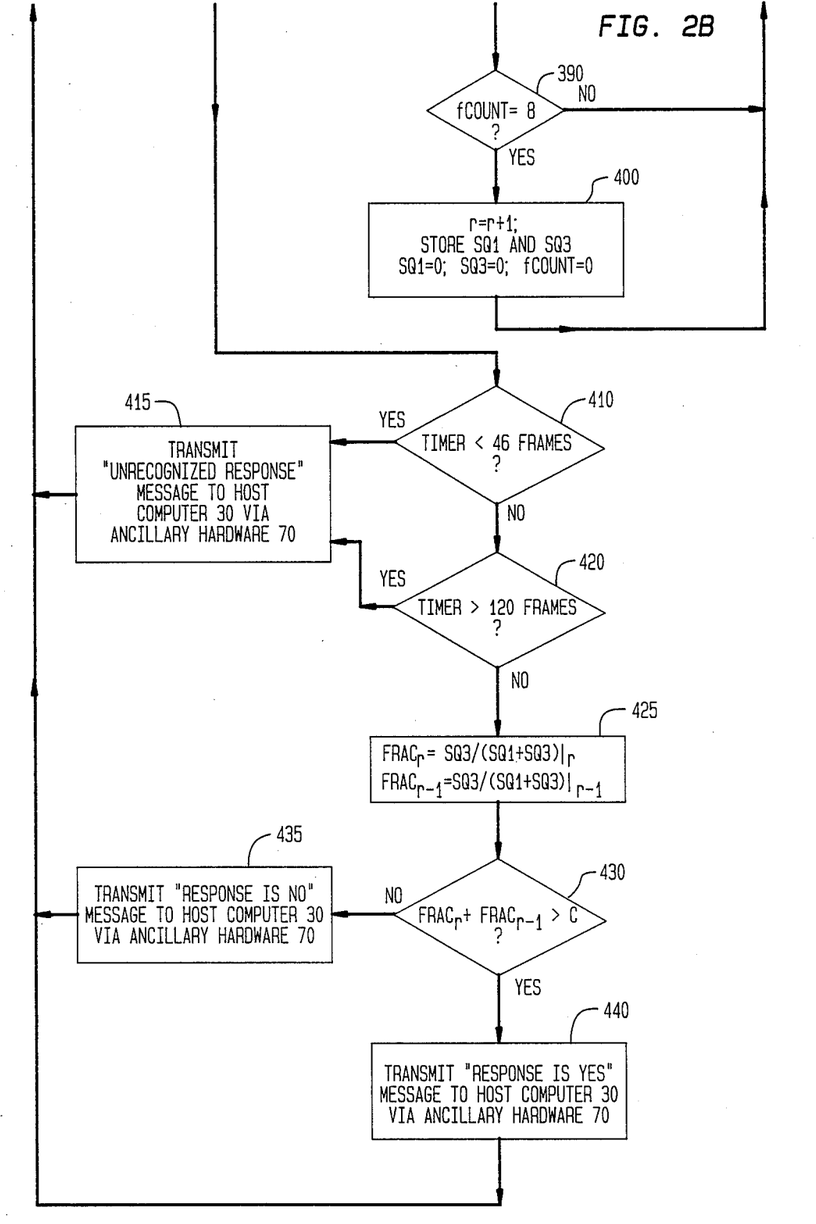

With the above-described description of an inventive method for determining the contents of predetermined frequency bins in the frequency spectrum of an analog signal in mind, we will describe how that method is used by microprocessor 50 in an analysis of digital samples of incoming analog signal 100 to identify an analog signal which was produced by a human response of "yes" under the direction of a software program which performs in accordance with the flow chart shown in FIG. 2. (Microprocessor 50 further communicates with memory 60 and with host computer 30 in the manner which is described in further detail below.)

Before describing the flowchart shown in FIG. 2, we will first describe, in general, how microprocessor 50 identifies a signal that was produced by a human voice response of "yes." As is well known in the art, the human voice response may be generated by a human in response to a query from an automated system. The inventive method and apparatus identify a sound on the basis of the variation of the energy content of predetermined frequency bins in the frequency spectrum over time. In particular, in a preferred embodiment of the inventive method and apparatus, a DFT is performed using 8 samples per frame and an analsis is made of the spectral dynamics of two predetermined frequency bins. Specifically, a measure of the energy is determined for frequency bins surrounding 750 Hz and 2250 Hz, respectively. Then, the fraction of the sum of the measure of the energy in these two bins which occurs in the higher frequency bin is determined. In accordance with the inventive method, since a human voice response of "yes" is expected to produce a large amount of energy at higher frequencies at the end of this human voice response, a signal is presumed to have been produced by a human voice response of "yes" is a large value of the fraction of the measure of the energy at the end of the sound occurs in the higher frequency bin. In general, we may compare the variation in the fraction of the total measure of energy which occurs in the higher frequency bin over time with a library of predetermined envelopes of such variations which are stored, for example, in a memory. In this instance, the signal is identified by comparing energy content of the predetermined frequency bins with the library envelopes.

In particular, the inventive method is implemented by detecting a signal whose energy level exceeds a predetermined amount. The time period during which this occurs, i.e., the period during which the human voice response or sound exists, is broken down into frames. In each frame, a predetermined number of samples of the signal are taken—a typical number of samples might be, for example, anywhere from 8 to 256 samples per frame. Then, for each frame, a measure of the sound energy which occurs in each of the two different portions of the frequency spectrum is determined. For example, $R^2_f + I^2_f$ can be used as a measure of energy in frequency bin f or $|R_f| + |I_f|$ can be used as the measure of energy in frequency bin f. Then, for each frame the fraction of the measure of energy in one of the two bins of interest as compared to the sum of the measure of energy in the two bins is determined. Finaly, the fraction of the measure of energy for a predetermined number of frames is compared with a predetermined indicator, such as the library envelope described above, to identify a signal which was produced by a human voice response of "yes."

As one can readily appreciate from this, the inventive method, as described just above, is useful in analyzing signals which are produced by a human voice response to identify human voice response which have a high frequency component, for example, the "s" in "yes" or the "t" in "two." Thus, in accordance with one embodiment of the inventive method, if the measure of the energy at the higher frequency bin in the frequency spectrum of the signal at the end of the sound, i.e., in the last several frames, we may assume that the human voice response was not "yes." In general, as discussed above, the dynamic fraction of the measure of the energy in two frequency bins of the signal may be compared with a library of envelopes stored in memory. If a close match is found between the dynamic fraction of the measure of the energy of the signal and one of the library envelopes, then one may be relatively certain that the type of human voice response has been identified. If the automated system which utilizes the inventive method cannot make such an identification, it may have to request the human to clarify its voice response.

In addition to the the above-described frequency analysis, it is advantageous to utilize the length of the sound as part of the inventive discrimination method. For example, a human voice response of "yes" or "no" should have a length in the range of 0.35 sec to 1.2 sec and any sound which is longer or shorter would require clarification. This is additionally useful in differentiating between a "yes," "no," a cough, telephone dropping, and so forth.

FIG. 2 shows a flow chart of a microprocessor program which forms part of the preferred embodiment of the inventive apparatus show in FIG. 1. Box 300 is a polling mechanism in microprocessor 50 which is energized after a predetermined time interval to cause control of the program in microprocessor 50 to transfer to decision box 310. It should be clear to those of ordinary skill in the art that embodiments of the present invention may operate just as well on an "alarm" basis.

Decision box 310 represents a point in the program at which microprocessor 50 requests and receives an input from a sound detector, not shown, in telephone network interface 25. A sound detector may be fabricated in accordance with methods well known to those of ordinary skill in the art and it transmits a signal to ancillary hardware 70, which signal is transmitted, in turn, to microprocessor 50. As is well known to those of ordinary skill in the art, a sound detector may be implemented in microprocessor 50 by a program which examines the energy in the incoming signal to determine whether the energy is above or below a predetermined level which indicates whether there is sound or silence, respectively. If the program in microprocessor 50 determines that there is silence, i.e., the input signal level is below a predetermined level, then the program in microprocessor 50 transfers control to box 300 to await until another time period has passed before making this examination again. If, however, the program in microprocessor 50 determines that there is no silence, i.e., the input signal is above the predetermined level, then the program in microprocessor 50 transfers control to the portion of the program which corresponds to box 320.

Box 320 represents a point in the program at which microprocessor 50 performs an initialization step to prepare for analyzing the input sound signal by setting the following parameters in memory 60 to 0: timer, fcount, r, SQ1 and SQ2. As will become clear below, timer is a parameter which keeps track of the number of frames during which the sound exists; fcount is a frame counter; r is a counter for counting a predetermined number of frames; and SQ1 and SQ3 are the measures of energy in frequency bins 1 and 3 of interest, respectively, for all the samples in a frame and for all frames in a group of, for example, 8 frames. Note: even though we are describing a preferred embodiment of the present invention which utilizes two bins, the present invention is not limited to two bins. Further note that all the values of $C_j(x_j,n)$ and $S_j(x_j,n)$ have been determined previously and have been stored previously in memory 60. Then the program in microprocessor 50 transfers control to box 330.

Box 330 represents a point in the program at which microprocessor 50 performs a frame initialization by setting the following parameters in memory 60 to 0: j, $R_1$, $I_1$, $R_3$, and $I_3$. As will become clear below, j is a sample index for the samples taken during a frame, $R_1$ and $I_1$ are the real and imaginary components of the frequency spectrum in bin 1 of interest, and $R_3$ and $I_3$ are the real and imaginary components of the frequency spectrum in frequency bin 3 of interest. Then the program in microprocessor 50 transfers control to box 340.

Box 340 represents a point in the program at which microprocessor 50: (1) receives a digitally encoded measurement, also referred to below as a digital sample, from analog-to-digital converter 40, through buffer 35, and (2) increments sample index j in memory 60 by 1. Then the program in microprocessor 50 transfers control to box 350.

Box 350 represents a point in the program at which microprocessor 50 retrieves the values of $C_j(x_j,\text{bin } 1)$, $S_j(x_j,\text{bin } 1)$, $C_j(x_j,\text{bin } 3)$, and $S_j(x_j,\text{bin } 3)$ from memory 60. Box 350 then performs the following sums, stores the results in memory 60, and transfers control to decision box 360:

$$R_1 = R_1 + C_j(x_j,\text{bin } 1)$$

$$I_1 = I_1 - S_j(x_j,\text{bin } 1)$$

$$R_3 = R_3 + C_j(x_j,\text{bin } 3)$$

$$I_3 = I_3 - S_j(x_j,\text{bin } 3)$$

This is shorthand for an evaluation of the following equations:

$$R_f = \underset{j=0}{\overset{N-1}{\text{Sum}}} x_j * \cos(fjQ)$$

where $Q = 2\pi/N$ $$I_f = -\underset{j=0}{\overset{N-1}{\text{Sum}}} [x_j * \sin(fj/N)]$$

where: $Q=2\pi/N$ and f refers to the frequency index of frequency bin 1 and frequency bin 3 of interest, respectively.

The following describes a preferred embodiment of the present invention wherein the above-described sums are determined using N separate microprocessor program subroutines, i.e., there is one subroutine for each of the N samples. Each of the subroutines determines the following for each bin:

$$R_f = R_f + x_j \cos(fjQ) \text{ and } I_f = I_f - x_j \sin(fjQ)$$

As an example, let the bins of interest correspond to $f=1$ and $f=3$. Let x denote the sample value of the $j^{th}$ sample. Then, in accordance with Table I, the N subroutines for eight samples $j=0$ to $j=7$ for this embodiment perform the following determinations:

| Sample No. | Equations |
|---|---|
| j = 0 | $R_1 = R_1 + x$ |
| | $R_3 = R_3 + x$ |
| | $I_1 = I_1 - 0 = I_1$ \|Not necessary to perform |
| | $I_3 = I_3 - 0 = I_3$ \|these calculations |
| | Return |
| j = 1 | $R_1 = R_1 + x\cos Q$ |
| | $R_3 = R_3 + x\cos 3Q = R_3 - x\cos Q$ |
| | $I_1 = I_1 - x\sin Q = I_1 - x\cos Q$ |
| | $I_3 = I_3 - x\sin 3Q = I_3 - x\cos Q$ |
| | Return |
| j = 2 | $R_1 = R_1 + x\cos 2Q = R_1 + 0 = R_1$ \|Not necessary |
| | $R_3 = R_3 + x\cos 6Q = R_3 + x\cos 2Q = R_3$ \|Not necessary |
| | $I_1 = I_1 - x\sin 2Q = I_1 - x\cos 0 = I_1 - x$ |
| | $I_3 = I_3 - x\sin 6Q = I_3 + x\cos 0 = I_3 + x$ |
| | Return |
| j = 3 | $R_1 = R_1 + x\cos 3Q = R1 - x\cos Q$ |
| | $R_3 = R_3 + x\cos 9Q = R_3 + x\cos Q$ |
| | $I_1 = I_1 - x\sin 3Q = I_1 - x\cos Q$ |
| | $I_3 = I_3 - x\sin 9Q = I_3 - x\sin Q = I_3 - x\cos Q$ |
| | Return |
| j = 4 | $R_1 = R_1 + x\cos 4Q = R_1 - x\cos 0 = R_1 - x$ |
| | $R_3 = R_3 + x\cos 12Q = R_3 + x\cos 40 = R_3 - x$ |
| | $I_1 = I_1 - x\sin 4Q = I_1 - x\cos 2Q = I_1$ \|Not necessary |
| | $I_3 = I_3 - x\sin 12Q = I_3 - x\sin 4Q = I_3$ \|Not necessary |
| | Return |
| j = 5 | $R_1 = R_1 + x\cos 5Q = R_1 - x\cos Q$ |
| | $R_3 = R_3 + x\cos 15Q = R_3 + x\cos 7Q = R_3 + x\cos Q$ |
| | $I_1 = I_1 - x\sin 5Q = I_1 - x\cos Q$ |
| | $I_3 = I_3 - x\sin 15Q = I_3 - x\sin 7Q = I_3 + x\cos Q$ |
| | Return |
| j = 6 | $R_1 = R_1 + x\cos 6Q = R_1 - x\cos 2Q = R_1$ \|Not necessary |
| | $R_3 = R_3 + x\cos 18Q = R_3 + x\cos 2Q = R_3$ \|Not necessary |
| | $I_1 = I_1 - x\sin 6Q = I_1 + x\cos 0 = I_1 + x$ |
| | $I_3 = I_3 - x\sin 18Q = I_3 - x\cos 0 = I_3 + x$ |
| | Return |
| j = 7 | $R_1 = R_1 + x\cos 7Q = R_1 + x\cos Q$ |
| | $R_3 = R_3 + x\cos 21Q = R_3 + x\cos 5Q = R_3 - x\cos Q$ |
| | $I_1 = I_1 - x\sin 7Q = I_1 + x\cos Q$ |
| | $I_3 = I_3 - x\sin 21Q = I_3 - x\sin 5Q = I_3 + x\cos Q$ |
| | Return |

Further, in this preferred embodiment, the above-described subroutine determinations are implemented by storing the following information in two tables, TABLE A and TABLE B. TABLE A comprises eight consecutive storage locations which contain the following:

TABLE A

| |
|---|
| 0 |
| 1cosQ |
| 2cosQ |
| 3cosQ |
| 4cosQ |
| 5cosQ |
| 6cosQ |
| 7cosQ |

TABLE B comprises eight consecutive storage locations which contain the addresses of each of the eight subroutines for $j=0$ to $j=7$. Note that because the number of samples $N=8$, the possible sample values will be taken to have the values $x=0,1,\ldots,7$. As a result, an entry in TABLE A is accessed by obtaining the contents of the location in, for example, memory 60, whose address is $A+x$, where A is the address of the first element of TABLE A and x is the sample value of the $j^{th}$ sample. Further, the address of the subroutine for the $j^{th}$ sample is given by the contents of the location, for example, memory 60, whose address if $B+j$, where B is the address of the first element of TABLE B.

The following illustrates how TABLES A and B are used to implement the above-described subroutines. Let $R_f+=x$ denote $R_f=R_f+x$; $R_f-=x$ denote $R_f=R_f-x$; where x is a sample value. Using this nomenclature, the above-described subroutines can be rewritten as follows:

| Sample No. | Instructions | Address for Subroutine |
|---|---|---|
| j = 0 | $R_1+ = x$ | *B |
| | | where *B denotes the contents of the first entry in TABLE B, i.e., the address of the subroutine for the j = 0 sample. |
| | $R_3+ = x$ | |
| | Return | |
| j = 1 | $R_1+ = *(A + x)$ | *(B + 1) |
| | | where *(A + x) denotes the contents of TABLE A at the address which is offset from the first address A by the sample value x. |
| | $R_3- = *(A + x)$ | |
| | $I_1- = *(A + x)$ | |
| | $I_3- = *(A + x)$ | |
| | Return | |
| j = 2 | $I_1- = x$ | *(B + 2) |
| | $I_3+ = x$ | |
| | Return | |
| j = 3 | $R_1- = *(A + x)$ | *(B + 3) |
| | $R_3+ = *(A + x)$ | |
| | $R_1+ = *(A + x)$ | |
| | $R_3- = *(A + x)$ | |
| | Return | |
| j = 4 | $R_1- = x$ | *(B + 4) |
| | $R_3- = x$ | |
| | Return | |
| j = 5 | $R_1- = *(A + x)$ | *(B + 5) |
| | $R_3+ = *(A + x)$ | |
| | $I_1+ = *(A + x)$ | |
| | $I_3+ = *(A + x)$ | |
| | Return | |
| j = 6 | $I_1+ = x$ | *(B + 6) |
| | $I_3- = x$ | |
| | Return | |
| j = 7 | $R_1+ = *(A + x)$ | *(B + 7) |
| | $R_3- = *(A + x)$ | |
| | $I_1+ = *(A + x)$ | |
| | $I_3+ = *(A + x)$ | |
| | Return | |

Decision box 360 represents a point in the program at which microprocessor 50 examines the sample index j to see if it has reached a predetermined number, here 8, indicative of the fact that we have reached the end of a frame. If the program in microprocessor 50 determines that the sample index j has not reached the predetermined number indicative of the fact that we have reached the end of a frame, then the program in microprocessor 50 transfers control to the portion of the program which corresponds to box 340, otherwise it transfers control to the portion of the program which corresponds to box 370.

Decision box 370 represents a point in the program at which microprocessor 50 requests and receives an input from the sound detector (not shown). If the program in microprocessor 50 determines that there is silence, i.e., the sound energy has fallen below a predetermined level, then the program in microprocessor 50 transfers control to decision box 410 to start an analysis to determine whether the signal was produced by a human voice response of "yes." If, however, the program in microprocessor 50 determines that there is no silence, i.e., the sound level has not yet fallen below the predetermined level, then the program in microprocessor 50 transfers control to the portion of the program which corresponds to box 380.

Box 380 represents a point in the program at which microprocessor 50 increments timer and fcount in memory 60 by one. Box 380 then performs the following sums, stores the results in memory 60, and transfers control to decision box 390.

$$SQ1 = SQ1 + R_1^2 + I_1^2$$

$$SQ3 = SQ3 + R_3^2 + I_3^2$$

Decision box 390 represents a point in the program at which microprocessor 50 examines the frame counter fcount to see if it has reached a predetermined number, here 8, indicative of the fact that we have reached the predetermined number of frames. If the program in microprocessor 50 determines that the frame counter fcount has not reached the predetermined number, then the program in microprocessor 50 transfers control to the portion of the program which corresponds to box 330 to prepare to receive another frame, otherwise it transfers control to the portion of the program which corresponds to box 400.

Box 400 represents a point in the program at which microprocessor 50 stores SQ1 and SQ3 in memory 60. Then the program in microprocessor 50: (1) increments frame group counter r; (2) sets SQ1, SQ3, and fcount to zero in memory 60; and (3) transfers control to box 330 to prepare for the next frame. As will be clear below, in this particular embodiment, one does not need to store SQ1 and SQ3 for each frame group. Instead, one merely stores these parameters for the last two frame groups encountered.

Decision box 410 represents a point in the program at which microprocessor 50 examines timer to see if the sound has lasted for a shorter length of time than a first predetermined length of time, for example, 46 frames. If the program in microprocessor 50 determines that timer is smaller than the first predetermined length—indicating that we have detected a short sound, then the program in microprocessor 50 transfers control to decision box 420.

Box 415 represents a point in the program at which microprocessor 50 sends a message to host computer 30 informing it that an unrecognized response has been received, then the program transfers control to the portion of the program which corresponds to box 300 to await the start of a new sound.

Decision box 420 represents a point in the program at which microprocessor 50 examines timer to see if the sound has lasted for a longer length of time than a second predetermined length of time, for example, 120 frames. If the program in microprocessor 50 determines that timer is larger than the second predetermined length—indicating that we have detected a long sound, then the program in microprocessor 50 transfers control to box 415. Otherwise the program in microprocessor 50 transfers control to box 425.

Box 425 represents a point in the program at which microprocessor determines $FRAC_r$ and $FRAC_{r-1}$. $FRAC_r$ is the fraction of the measure of energy in bin 3 when compared to the sum of the measure of energy of bins 1 and 3 for the $r^{th}$ group of frames, i.e., the last group of frames before silence. $FRAC_{r-1}$ is the same fraction for the previous group of frames. The fraction is determined as follows:

$$FRAC_r = SQ3/(SQ1 + SQ3)$$

Then the program transfers control to the portion of the program which corresponds to decision box 430.

Decision box 430 represents a point in the program at which microprocessor 50 examines the sum of the fraction of the measure of energy over the last two groups of frames, for example, each group in this case has 8 frames, to see if the sum of the fraction of total energy measure is greater than a predetermined amount. For example, in this embodiment, the predetermined amount C corresponds to the minimum value which the sum of the fraction of the measure of energy in the higher frequency bin must exceed for the sound to have been a "yes." If the program in microprocessor 50 determines that the sum is greater than the predetermined amount C, then the program in microprocessor 50 transfers control to box 440 to announce that the human voice response was identified as a "yes," otherwise the program in microprocessor 50 transfers control to box 435 to announce, for example, that the hyman voice response was a "no" if the applications system had requested a "yes" or "no" response.

Box 435 represents a point in the program at which microprocessor 50 sends a message to host computer 30 informing it that a "no" has been received, then the program transfers control to the portion of the program which corresponds to box 300 to await the start of a new sound.

Box 440 represents a point in the program at which microprocessor 50 sends a message to host computer 30 informing it that a "yes" has been received, then the program transfers control to the portion of the program which corresponds to box 300 to await the start of a new sound.

As should be clear to those of ordinary skill in the art, further embodiments of the present invention may be made without departing from its teachings. For example, (1) the inventive method and apparatus can examine any particular frequency bins of interest; (2) the inventive method and apparatus is not limited to examining only two bins; (3) the inventive method and apparatus can use a whole host of representations as a measure of the energy in a frequency bin; (4) the inventive method and apparatus can compare the variation in a measure of energy for various predetermined frequency bins which may be weighed in a predetermined fashion against a library of predetermined envelopes; (5) the inventive method and apparatus may digitally encode an analog signal using a differentially encoded format or a non-differentially encoded format such as a linearly encoded digital signal or a digital signal which has been encoded according to a u-law format or an A-law format; and (6) the inventive method and apparatus may be used to directly examine digitally encoded signals and such embodiments would not require a step of converting from analog to digitally encoded form.

What is claimed is:

1. A method for identifying an analog or digital signal on a telecommunications line which was produced by a predetermined human voice response, which method comprises the steps of:

(a) storing $C_k(x_k,n)$ and $S_k(x_k,n)$ where:

$C_k(x_k,n) = x_k * \cos(2\pi kn/N)$ and $S_k(x_k,n) = x_k * \sin(2\pi kn/N)$ for: $k = 0, \ldots, (N-1)$; $n = 0, \ldots, (N-1)$; and $x_k$ ranging over all the values of a set of M predetermined digital levels into which the amplitude of the signal is mapped, if the signal is a digital signal, or into which samples of the amplitude of the signal is mapped, if the signal is an analog signal where: N is a predetermined number of values of the signal, if the signal is a digital signal, or N is the predetermined number of samples of the signal, if the signal is an analog signal, which values or samples are used in determining at least a portion of the frequency spectrum; and n is an index of frequency bins of the frequency spectrum;

(b) determining the sound level of the signal and, when the sound level of the signal exceeds a first predetermined sound level, setting a timer and a frame counter;

(c) obtaining a digital value from the signal, the digital value comprising an amplitude value of the signal if the signal is a digital signal and the digital value comprising a sample of the amplitude of the signal if the signal is an analog signal;

(d) matching the digital value with one of the predetermined set of M predetermined digital levels into which the signal is mapped to provide a value $x_j$;

(e) retrieving $C_j(x_j,f)$ and $S_j(x_j,f)$ from storage for each of predetermined frequency bins f for the value $x_j$;

(f) accumulating the sum of $C_j(x_j,f)$ and $S_j(x_j,f)$ for N digital values $x_j$, by repeating steps (c) through step (f) a sufficient number of times, to provide the real and imaginary part of the content for each of the predetermined frequency bins f;

(g) determining the sound level of the signal and, when the sound level of the signal falls below a second predetermined sound level, proceeding to step (i), otherwise proceeding to step (h);

(h) determining a measure of energy for each of the predetermined frequency bins f from the real and imaginary part of the content thereof, incrementing the frame counter and the timer and, if the frame counter is less than a predetermined frame count, proceeding to step (c), otherwise, storing the measure of energy in the predetermined frequency bins f for predetermined frames, resetting the frame counter and proceeding to step (c);

(i) determining if the timer is outside of a predetermined time range and, if so, transmitting a message that the signal corresponds to an unrecognized response;

(j) comparing variations of functions of the measure of energy for the predetermined frequency bins f in predetermined frames with predetermined variations of the measure of energy for the predetermined frequency bins f for the predetermined human voice response and, if they compare within predetermined limits, transmitting a message that the predetermined human voice response has been detected.

2. The method of claim 1 wherein step (a) of storing comprises storing all of the values of $C_k(x_k,n)$ and $S_k(x_k,n)$ and wherein step (e) of retrieving $C_j(x_j,f)$ and $S_j(x_j,f)$ utilizes the values $x_j$ as a pointer into storage.

3. The method of claim 1 wherein step (a) of storing comprises storing a subset of all of the values of $C_k(x_k,n)$ and $S_k(x_k,n)$, wherein the subset includes values which are different.

4. The method of claim 3 wherein step (e) of retrieving and step (f) of accumulating are performed on a processor wherein a different subroutine is used to carry out step (e) of retrieving and step (f) of accumulating for each of the N values.

5. The method of claim 1 wherein step (h) of determining a measure of energy for each of the predetermined frequency bins f comprises summing the absolute value of the real and the absolute value of the imaginary part of the contents of each of the predetermined frequency bins f.

6. The method of claim 1 wherein step (h) of determining a measure of energy for each of the predetermined frequency bins f comprises summing the square of the real and the square of the imaginary part of the contents of each of the predetermined frequency bins f.

7. The method of claim 1 for use in identifying a signal which was produced by a human voice response of "yes" wherein the predetermined number of frequency bins f is two.

8. The method of claim 7 wherein one of the predetermined frequency bins f has a substantially higher frequency than the other.

9. The method of claim 8 wherein step (h) of determining a measure of energy and storing the measure for predetermined frames comprises storing the measure for the last two frames where the sound level of the signal exceeded the second predetermined sound level, the measure for the lower frequency bin being referred to as the "lower frequency measure" and the measure for the higher frequency bin being referred to as the "higher frequency measure";

wherein step (j) of comparing comprises determining a fraction for each of the last two frames, which fraction equals:

$$\frac{\text{"higher frequency measure"}}{\text{"lower frequency measure"} + \text{"higher frequency measure"}}$$

and comparing the sum of the fractions for the last two frames with a predetermined amount and transmitting a message that the predetermined human voice response was "yes" if the sum of the fractions exceeds the predetermined amount.

10. A method for identifying an analog or digital signal on a telecommunications line which was produced by a predetermined human voice response, which method comprises the steps of:

(a) storing $C_k(x_k,n)$ and $S_k(x_k,n)$ where:

$C_k(x_k,n) = x_k * \cos(2\pi kn/N)$ and $S_k(x_k,n) = x_k * \sin(2\pi kn/N)$ for: k=0, ..., (N−1); n=0, ..., (N−1); and $x_k$ ranging over all the values of a set of M predetermined digital levels into which the amplitude of the signal is mapped, if the signal is a digital signal, or into which a sample of the amplitude of the signal is mapped, if the signal is an analog signal where: N is a predetermined number of values of the signal, if the signal is a digital signal, or N is a predetermined number of samples of the signal, if the signal is an analog signal, which values or samples are used in determining at least a portion of the frequency spectrum; and n is an index of frequency bins of the frequency spectrum;

(b) determining the sound level of the signal and, when the sound level of the signal exceeds a first predetermined sound level, setting a timer and a frame counter;

(c) obtaining digital values from the signal, the digital values comprising N amplitude values of the signal if the signal is a digital signal and the digital values comprising N samples of the amplitude of the signal if the signal is an analog signal;

(d) matching each of the digital values with one of the predetermined set of M predetermined digital levels into which the signal is mapped to provide N values $x_j$ for j=0, ..., N−1;

(e) retrieving $C_j(x_j,f)$ and $S_j(x_j,f)$ from storage for each of predetermined frequency bins f and each of the N values $x_j$;

(f) accumulating the sum of $C_j(x_j,f)$ and $S_j(x_j,f)$ for the N values $x_j$ to provide the real and imaginary part of the content for each of the predetermined frequency bins f;

(g) determining the sound level of the signal and, when the sound level of the signal falls below a second predetermined sound level, proceeding to step (i), otherwise proceeding to step (h);

(h) determining a measure of energy for each of the predetermined frequency bins f from the real and imaginary part of the content thereof, incrementing the frame counter and the timer and, if the frame counter is less than a predetermined frame count, proceeding to step (c), otherwise, storing the measure of energy in the predetermined frequency bins f for predetermined frames, resetting the frame counter and proceeding to step (c);

(i) determining if the timer is outside of a predetermined timer range and, if so transmitting a message that the signal corresponds to an unrecognized response;

(j) comparing variations of functions of the measure of energy for the predetermined frequency bins f in predetermined frames with predetermined variations of the measure of energy for the predetermined frequency bins f for the predetermined human voice response and, if they compare within predetermined limits, transmitting a message that the predetermined human voice response has been detected.

11. Apparatus for identifying an analog or digital signal on a telecommunications line which was produced by a predetermined human voice response, which apparatus comprises:

storage means for storing $C_k(x_k,n)$ and $S_k(x_k,n)$ where:

$C_k(x_k,n) = x_k * \cos(2\pi kn/N)$ and $S_k(x_k,n) = x_k * \sin(2\pi kn/N)$ for: k=0, ..., (N−1); n=0, ..., (N−1); and $x_k$ ranging over all the values of a set of M predetermined digital levels into which the amplitude of the signal is mapped, if the signal is a digital signal, or into which a sample of the amplitude of the signal is mapped, if the signal is an analog signal where: N is a predetermined number of values of the signal, if the signal is a digital signal, or N is a predetermined number of samples of the signal, if the signal is an analog signal, which are used in determining at least a portion of the frequency spectrum; and n is an index of frequency bins of the frequency spectrum;

sound level for determining the sound level of the signal and for transmitting a sound level indicator signal;

first initial means, responsive to the sound level indicator signal, for setting a timer and a frame counter when the sound level of the signal exceeds a first predetermined sound level and for sending a signal to a second initial means;

second initial means, responsive to a signal from a measure means or the first initial means, for initializing a sum of $C_j(x_j,f)$ and $S_j(x_j,f)$ for N amplitude values of the signal, if the signal is a digital signal, or for N samples of the amplitude of the signal, if the signal is an analog signal, and for sending a signal to a value means;

value means, responsive to a signal from the first initial means or the accumulating means, for obtaining a digital value from the signal, the digital value comprising an amplitude value of the signal if the signal is a digital signal and the digital value comprising a sample of the amplitude of the signal if the signal is an analog signal;

matching means, responsive to a signal from the value means, for matching the digital value with one of the predetermined set of M predetermined digital levels into which the signal is mapped to provide a value $x_j$;

retrieving means, responsive to a signal from the matching means, for retrieving $C_j(x_j,f)$ and $S_j(x_j,f)$ from the storage means for each of predetermined frequency bins f for the value $x_j$;

accumulating means, responsive to a signal from the retrieving means, for accumulating the sum of $C_j(x_j,f)$ and $S_j(x_j,f)$ for the value of $x_j$ to provide the real and imaginary part of the content for each of the predetermined frequency bins f and for determining if this is the Nth value of $x_j$ and, if so, for transmitting a signal to a level means, otherwise, transmitting a signal to the value means;

level means, responsive to a signal from the accumulating means and the sound level indicator signal, for determining the sound level of the signal and, when the sound level of the signal falls below a second predetermined sound level, for sending a signal to a time check means, otherwise, for sending a signal to the measure means;

measure means, responsive to a signal from the level means, for determining a measure of energy for each of the predetermined frequency bins f from the real and imaginary part of the content thereof, for incrementing the frame counter and the timer and, if the frame counter is less than a predetermined frame count, for sending a signal to the second initial means, otherwise, for storing the measure of energy in the predetermined frequency bins f for predetermined frames, for resetting the frame counter, and for sending a signal to the second initial means;

time check means, responsive to a signal from the level means, for determining if the timer is outside of a predetermined time range and, if so, for transmitting a message signal denoting that the signal corresponds to an unrecognized response; and, otherwise, for transmitting a signal to a comparison means;

comparison means, responsive to a signal from the time check means, for comparing variations of functions of the measure of energy for the predetermined frequency bins f in predetermined frames with predetermined variations of functions of the measure of energy for the predetermined frequency bins f for the predetermined human voice response and, if they compare within predetermined limits, for transmitting a message signal denoting that the predetermined human voice response has been detected.

12. The apparatus of claim 11 wherein the storage means comprises means for storing all of the values of $C_k(x_k,n)$ and $S_k(x_k,n)$ and wherein the retrieving means for retrieving $C_j(x_j,f)$ and $S_j(x_j,f)$ utilizes the values $x_j$ as a pointer into storage.

13. The apparatus of claim 11 wherein the storage means comprises means for storing a subset of all of the values of $C_k(x_k, n)$ and $S_k(x_k,n)$, wherein the subset includes values which are different.

14. The apparatus of claim 13 wherein the retrieving means and the accumulating means comprise a processor means wherein a different subroutine retrieves and accumulates for each of the N values.

15. The apparatus of claim 11 wherein the measure means comprises means for summing the absolute value of the real and the absolute value of the imaginary part of the contents of each of the predetermined frequency bins f.

16. The apparatus of claim 11 wherein the measure means comprises means for summing the square of the real and the square of the imaginary part of the contents of each of the predetermined frequency bins f.

17. The apparatus of claim 11 for use in identifying a signal which was produced by a human voice response of "yes" wherein the predetermined number of frequency bins f is two.

18. The apparatus of claim 17 wherein one of the predetermined frequency bins f has a substantially higher frequency than the other.

19. The apparatus of claim 18 wherein the measure means comprises means for storing the measure for the last two frames where the sound level of the signal exceeded the second predetermined sound level, the measure for the lower frequency bin being referred to as the "lower frequency measure" and the measure for the higher frequency bin being referred to as the "higher frequency measure";

wherein the comparison means comprises means for determining a fraction for each of the last two frames, which fraction equals:

$$\frac{\text{"higher frequency measure"}}{\text{"lower frequency measure"} + \text{"higher frequency measure"}}$$

and means for comparing the sum of the fractions for the last two frames with a predetermined amount and for transmitting a message signal denoting that the predetermined human voice response was "yes" if the sum of the fractions exceeds the predetermined amount.

20. Apparatus for identifying an analog or digital signal on a telecommunications line which was produced by a predetermined human voice response, which apparatus comprises:

means for storing $C_k(x_k,n)$ and $S_k(x_k,n)$ where:

$C_k(x_k,n)=x_k*\cos(2\pi kn/N)$ and $S_k(x_k,n)=x_k*\sin(2\pi kn/N)$ for: $k=0, \ldots, (N-1)$; $n=0, \ldots, (N-1)$; and $x_k$ ranging over all the values of a set of M predetermined digital levels into which the amplitude of the signal is mapped, if the signal is a digital signal, or into which a sample of the amplitude of the signal is mapped, if the signal is an analog signal where: N is a predetermined number of values of the signal, if the signal is a digital signal, or N is a predetermined number of samples of the signal, if the signal is an analog signal, which are used in determining at least a portion of the frequency spectrum; and n is an index of frequency bins of the frequency spectrum;

sound level means for determining the sound level of the signal and for transmitting a sound level indicator signal;

initial means, responsive to the sound level indicator signal, for setting a timer and a frame counter when the sound level of the signal exceeds a first predetermined sound level and for sending a signal to a value means;

value means, responsive to a signal from the initial means or a measure means, for obtaining digital values from the signal, the digital values comprising N amplitude values of the signal if the signal is a digital signal and the digital values comprising N samples of the amplitude of the signal if the signal is an analog signal;

matching means, responsive to a signal from the value means, for matching each of the digital values with one of the predetermined set of M predetermined digital levels into which the signal is mapped to provide N values $x_j$ for $j=0, \ldots, N-1$;

retrieving means, responsive to a signal from the matching means, for retrieving $C_j(x_j,f)$ and $S_j(x_j,f)$ from the storage means for each of predetermined frequency bins f and each of the values $x_j$;

accumulating means, responsive to a signal from the retrieving means, for accumulating the sum of $C_j(x_j,f)$ and $S_j(x_j,f)$ for the N values $x_j$ to provide the real and imaginary part of the content for each of the predetermined frequency bins f, and for sending a signal to a level means;

level means, responsive to a signal from the accumulating means and the sound level indicator signal, for determining the sound level of the signal and, when the sound level of the signal falls below a second predetermined sound level, for sending a signal to a time check means, otherwise, for sending a signal to the measure means;

measure means, responsive to a signal from the level means, for determining a measure of energy for each of the predetermined frequency bins f from the real and imaginary part of the content thereof, for incrementing the frame counter and the timer and, if the frame counter is less than a predetermined frame count, for sending a signal to the value means, otherwise: for storing the measure of energy in the predetermined frequency bins f for predetermined frames, for resetting the frame counter, and for sending a signal to the value means;

time check means, responsive to a signal from the level means, for determining if the timer is outside of a predetermined time range and, if so, for transmitting a message signal denoting that the signal corresponds to an unrecognized response; and, otherwise, for transmitting a signal to a comparison means;

comparison means, responsive to a signal from the time check means, for comparing variations of functions of the measure of energy for the predetermined frequency bins f in predetermined frames with predetermined variations of functions of the measure of energy for the predetermined frequency bins f for the predetermined human voice response and, if they compare within predetermined limits, for transmitting a message signal denoting that the predetermined human voice response has been detected.

* * * * *